US009893011B2

(12) United States Patent
Bao et al.

(10) Patent No.: US 9,893,011 B2
(45) Date of Patent: Feb. 13, 2018

(54) BACK-END ELECTRICALLY PROGRAMMABLE FUSE

(71) Applicant: INTERNATIONAL BUSINESS MACHINES CORPORATION, Armonk, NY (US)

(72) Inventors: Junjing Bao, San Diego, CA (US); Griselda Bonilla, Fishkill, NY (US); Kaushik Chanda, San Jose, CA (US); Samuel S. Choi, Beacon, NY (US); Ronald G. Filippi, Wappingers Falls, NY (US); Stephan Grunow, Saratoga, NY (US); Naftali E. Lustig, Croton on Hudson, NY (US); Dan Moy, Bethel, CT (US); Andrew H. Simon, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/872,627

(22) Filed: Oct. 1, 2015

(65) Prior Publication Data
US 2016/0027733 A1 Jan. 28, 2016

Related U.S. Application Data

(62) Division of application No. 13/348,011, filed on Jan. 11, 2012.

(51) Int. Cl.
*H01L 23/525* (2006.01)
*H01L 21/768* (2006.01)
(Continued)

(52) U.S. Cl.
CPC .... *H01L 23/5256* (2013.01); *H01L 21/76805* (2013.01); *H01L 21/76807* (2013.01);
(Continued)

(58) Field of Classification Search
CPC ............ H01L 23/5226; H01L 23/5256; H01L 21/768; H01L 21/46805; H01L 21/76807
See application file for complete search history.

(56) References Cited

U.S. PATENT DOCUMENTS 6,013,581 A * 1/2000 Wu ................... H01L 21/76813
216/18
6,060,380 A * 5/2000 Subramanian .... H01L 21/31144
257/E21.257
(Continued)

FOREIGN PATENT DOCUMENTS

CN 1770443 A 5/2006
CN 1881576 A 12/2006
(Continued)

OTHER PUBLICATIONS

International Search Report for application No. PCT/US2013/020930, dated Apr. 29, 2013.
(Continued)

*Primary Examiner* — Ermias Woldegeorgis
(74) *Attorney, Agent, or Firm* — Leonard T. Guzman

(57) ABSTRACT

A BEOL e-fuse is disclosed which reliably blows in the via and can be formed even in the tightest pitch BEOL layers. The BEOL e-fuse can be formed utilizing a line first dual damascene process to create a sub-lithographic via to be the programmable link of the e-fuse. The sub-lithographic via can be patterned using standard lithography and the cross section of the via can be tuned to match the target programming current.

4 Claims, 15 Drawing Sheets

(51) Int. Cl.
*H01L 23/522* (2006.01)
*H01H 85/02* (2006.01)

(52) U.S. Cl.
CPC .. *H01L 21/76811* (2013.01); *H01L 21/76816* (2013.01); *H01L 23/5226* (2013.01); *H01H 2085/0275* (2013.01); *H01L 2924/0002* (2013.01)

(56) References Cited

U.S. PATENT DOCUMENTS

| | | | |
|---|---|---|---|
| 6,107,204 A | | 8/2000 | Yu et al. |
| 6,140,226 A * | | 10/2000 | Grill ................ H01L 21/76811 257/E21.579 |
| 6,181,012 B1 | | 1/2001 | Edelstein et al. |
| 6,252,292 B1 | | 6/2001 | Brintzinger et al. |
| 6,312,874 B1 * | | 11/2001 | Chan ................ H01L 21/31116 257/E21.035 |
| 6,376,366 B1 * | | 4/2002 | Lin .................... H01L 21/31116 257/E21.252 |
| 6,399,284 B1 | | 6/2002 | Lyons |
| 6,399,496 B1 | | 6/2002 | Edelstein et al. |
| 6,459,151 B1 | | 10/2002 | Chung et al. |
| 6,524,947 B1 * | | 2/2003 | Subramanian .... H01L 21/76811 257/E21.579 |
| 7,553,760 B2 | | 6/2009 | Yang et al. |
| 7,696,085 B2 | | 4/2010 | Li et al. |
| 7,709,880 B2 | | 5/2010 | Bertin et al. |
| 7,772,581 B2 | | 8/2010 | Lung |
| 7,989,291 B2 | | 8/2011 | Clevenger et al. |
| 2003/0089987 A1 * | | 5/2003 | Parikh ................ H01L 21/7681 257/758 |
| 2005/0285222 A1 * | | 12/2005 | Thei .................... H01L 23/5256 257/529 |
| 2007/0262414 A1 | | 11/2007 | Ueda |
| 2008/0093743 A1 | | 4/2008 | Yang et al. |
| 2008/0150138 A1 | | 6/2008 | Bright et al. |
| 2009/0200674 A1 * | | 8/2009 | Yang ................. H01L 21/76813 257/758 |
| 2009/0273055 A1 | | 11/2009 | Thei et al. |
| 2010/0164111 A1 * | | 7/2010 | Yang ................. H01L 21/76814 257/758 |
| 2010/0283121 A1 | | 11/2010 | Black et al. |

FOREIGN PATENT DOCUMENTS

| | | |
|---|---|---|
| CN | 101165874 A | 4/2008 |
| CN | 101383337 A | 3/2009 |
| CN | 101617394 A | 12/2009 |
| CN | 102246293 A | 11/2011 |
| CN | 104040711 A | 9/2014 |
| GB | 2512009 A | 9/2014 |
| KR | 20050054066 A | 6/2005 |
| KR | 1020050054066 A | 6/2005 |
| WO | 2013106502 A1 | 7/2013 |

OTHER PUBLICATIONS

Chi Ho Lau, et al. "Fabrication of Nanoscale Vias by Offset Patterning", Proceedings of MicroNano08, Jun. 3-5, 2008, Clear Water Bay, Kowloon, Hong Kong, pp. 615-618.

R. Brain, et al. "Low-k Interconnect Stack with a Novel Self-Aligned Via Patterning Process for 32nm High Volume Manufacturing", 2009 IEEE, pp. 249-251.

U.S. Office Action dated Oct. 7, 2015 received in U.S. Appl. No. 13/348,011.

* cited by examiner

BACK-END ELECTRICALLY PROGRAMMABLE FUSE

FIELD OF THE INVENTION

The present invention relates to electronic fuses (e-fuses) for integrated circuits. More specifically, the present invention relates to an e-fuse formed in the back end of the line (BEOL) interconnect metal layers.

BACKGROUND OF THE INVENTION

In advanced integrated circuit technologies, e-fuses have been implemented at the polycrystalline silicon (PC) level. During programming, a high current pulse of short duration can be passed through an e-fuse structure to irreversibly migrate silicide on top of the PC, causing a change in resistance and thus acting as a programmable fuse. However, as scaling continues to tighter pitch, it is becoming harder to implement e-fuses at the PC level for certain device integration schemes with high-k metal gate processes. As such, there is a drive to implement e-fuses at the metal interconnect levels (i.e., a back-end or "BEOL e-fuse") and use the phenomenon of electromigration (EM) to program the fuses.

A conventional BEOL e-fuse structure includes via 124 connecting an upper line 122 and a lower line 112 as depicted in FIG. 1A. Line 122 can be connected to perform as the e-fuse anode and line 112 as the cathode, with electron flow from line 112 through via 124 to line 122. Via 124 can be a single via or a stacked via. There are several challenges with implementing a BEOL e-fuse. For one, programming the BEOL e-fuse can require more current than the PC e-fuse at least partly due to the fact that the liner materials used with copper interconnects, such as tantalum (Ta) and tantalum nitride (TaN), must be blown along with the copper in order to achieve proper fuse programming. US Patent Publication 2005/0285222 A1 by Thei et al. suggests to enable programming an e-fuse at lower current by intentionally misaligning via 224 relative to lower line 212 (or vs upper line 222 or both), as shown in FIG. 2A (depicting FIG. 14a of Thei et al). When offset by distance "D", the contact area X at the via/line interface is reduced which theoretically concentrates current density at that interface. But this approach is not reliable since during processing the contact area can also extend vertically to include area Y (see FIG. 2B). This via offset design also makes the structure susceptible to current leakage to neighboring circuit elements thus lowering reliability and yield. Furthermore, such misalignment relative to the upper line 222 requires a single damascene process which adds to the cost of manufacturing.

In addition to requiring a relatively high programming current, a further problem with the conventional BEOL e-fuse is controlling the location of the void. Line-level features adjacent to the e-fuse elements can be quite close, such that when a programming surge through a BEOL e-fuse causes a void to open within line 122, an overlying cap layer (not shown) or dielectric 125 can be damaged, and that can enable current leakage to the adjacent line-level features. Having the void occur in via 124 would be preferred, and can be promoted by ensuring that the programming surge creates greater current density in the via than in other portions of the electrical path. One option is to design via 124 to have a smaller cross section than line 122, but at the tightest pitch levels, lithography is not capable of forming such a 'smaller cross section via' when the lines are made at the minimum lithographic dimension.

In state of the art integrated circuitry, the most advanced lithography available is used to form the semiconductor devices, as well as the lowest interconnect levels (e.g., "M1" and "M2"). The smallest wiring dimension (also referred to as the critical dimension or 'CD' or 'groundrule' dimension) that can be patterned lithographically correlates to the device dimensions made by that lithography. Table 1 shows the anticipated device gate length and corresponding wiring pitch at M1, according to the "International Technology Roadmap for Semiconductors, 2010 update", hereby incorporated by reference.

TABLE 1

INTC6 MPU Interconnect Technology Requirements

| | Year of Production | | | | | |
|---|---|---|---|---|---|---|
| | 2011 | 2012 | 2013 | 2014 | 2015 | 2016 |
| Gate Length (nm) | 24.2 | 22.09 | 20.17 | 18.41 | 16.80 | 15.34 |
| M1 wiring pitch (nm) | 86 | 72 | 61 | 54 | 48 | 43 |
| Barrier/cladding thickness (for Cu M1 wiring) (nm) | 2.9 | 2.6 | 2.4 | 2.1 | 1.9 | 1.7 |

The minimum or lithographic pitch, as shown in FIG. 1B (at least in the tightest pitch interconnect layers), is the sum of the minimum line width "W" (groundrule line width) and minimum spacing "S" (groundrule space) between adjacent features. A structure having a dimension smaller than half pitch shall be referred to herein as a "sub-lithographic" or "sub-groundrule" structure.

Various techniques have been proposed to form a sub-lithographic via, for example, U.S. Pat. No. 7,696,085 to Li et al. discloses a sub-lithographic via in a dual damascene metal interconnect structure formed by patterning a via opening at a standard dimension, then back filling the opening using self-assembling block copolymers ("SABC"). The deposition and patterning of the SABC adds process steps, complexity and expense.

Another technique is disclosed in "Fabrication of Nanoscale Vias by Offset Patterning", by Chi Ho Lau and S. W. Ricky Lee (Proceedings of MicroNano08, Jun. 3-5, 2008, Hong Kong). According to this technique, a first via having standard photolithographic size is formed in a first dielectric layer according to a via mask. An etch stop and a second dielectric layer are then deposited. The second dielectric is patterned just as the first except the mask is offset. The via etched according to the intersection of the patterns has a reduced cross section. This process is undesirable since it requires two via patterning steps.

There remains a need for an inexpensive BEOL e-fuse that can be reliably programmed by electromigration that creates a void in the via.

SUMMARY OF THE INVENTION

According to the present invention, a BEOL e-fuse which reliably blows in the via can be formed even in the tightest pitch BEOL layers. In a first aspect the invention provides a BEOL e-fuse that includes a conductive via having a sub-lithographic dimension, such via conductively coupled between a first BEOL conductive feature and a second BEOL conductive feature, the first BEOL conductive feature connected as a cathode and the second BEOL conductive feature connected as an anode. Either or both of the BEOL conductive features can have a groundrule dimension. The second BEOL conductive feature can be within the interconnect layer directly above the first BEOL conductive feature. In some embodiments, the conductive via comprises a stack of elements, at least one of such elements having a sub-lithographic dimension.

According to another aspect, the invention provides a pair of lithographic masks where first mask of said pair embodies a trench pattern, and a second mask of said pair embodies a via pattern, where the via pattern is positioned to only partially overlap said trench pattern. The via pattern can be positioned to partially overlap the side of the trench or the end of the trench.

According to another aspect, the invention provides a method to form a BEOL e-fuse. The method requires providing a structure having a hard mask over a second dielectric layer, that second dielectric layer disposed over a first dielectric layer within which a conductive line is disposed, then forming a first opening through the hard mask, patterning a second opening which partially overlaps the first opening to define an overlap portion, where the overlap portion has a sub-groundrule dimension, and etching the overlap portion through the second dielectric layer to form a via cavity. In embodiments, either or both of the first opening and the second opening can have a groundrule dimension.

According to a further embodiment, the present invention provides a method to program a BEOL e-fuse, the method comprising providing a BEOL structure including a sub-lithographic via coupled between a first conductive feature wired as a cathode and a second conductive feature wired as an anode; and forming a void in said sub-lithographic via by applying a current between said anode and said cathode.

BRIEF DESCRIPTION OF THE DRAWINGS

The features and elements of the present invention are described below in conjunction with the accompanying figures.

DETAILED DESCRIPTION OF THE INVENTION

Figure 1A:
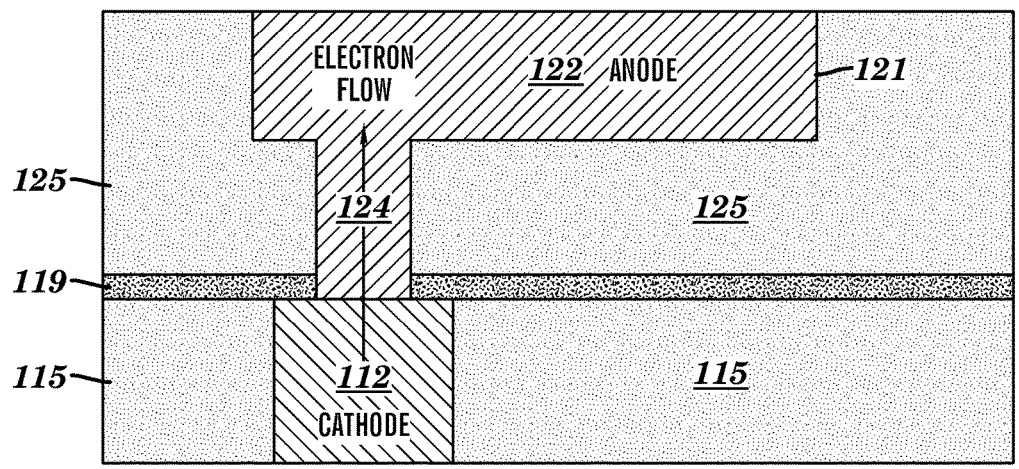
FIG. 1A illustrates a conventional back-end e-fuse.
Figure 1B:
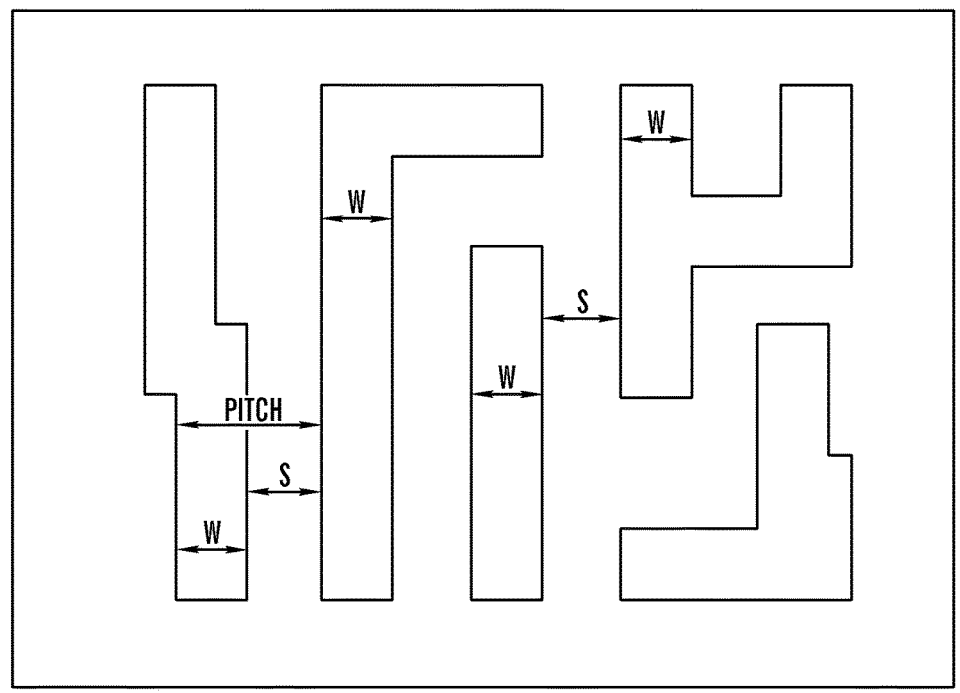
FIG. 1B illustrates "pitch" and "critical dimension" for a given lithography.
Figure 2A:
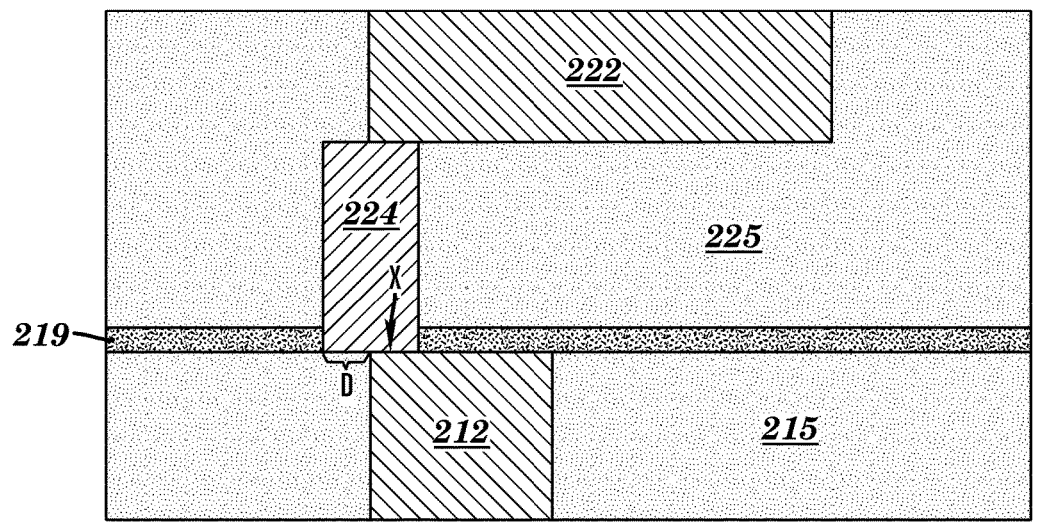
FIGS. 2A and 2B illustrate a prior art back-end e-fuse.
Figure 2B:
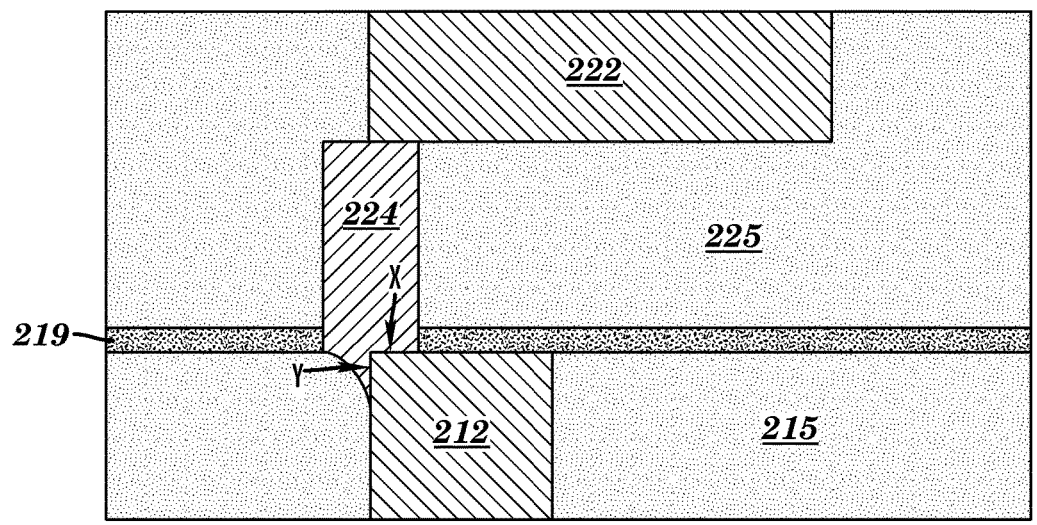

The present invention provides a back end of the line (BEOL) fuse structure which reliably blows in the via and can be formed even in the tightest pitch BEOL layers. The present e-fuse includes a sub-lithographic via coupled between two BEOL conductive features such as lines, a first of such feature being connected as a cathode and a second of such feature being connected as an anode. The cross section of this sub-lithographic via can be tuned to match the target programming current.

It will be understood that when a first element as a layer, region or substrate is referred to as being "on" or "over" a second element, it can be directly on such second element or intervening elements may also be present. In contrast, when an element is referred to as being "directly on" or "directly over" a second element, there are no intervening elements present. It will also be understood that when an element is referred to as being "connected" or "coupled" to another element, the two elements can be directly connected or coupled or intervening elements may be present. In contrast, when an element is referred to as being "directly connected" or "directly coupled" to another element, there are no intervening elements present. It is noted that like reference numerals refer to like elements across different embodiments, and that the drawings are not necessarily drawn to scale.

Figure 3A:
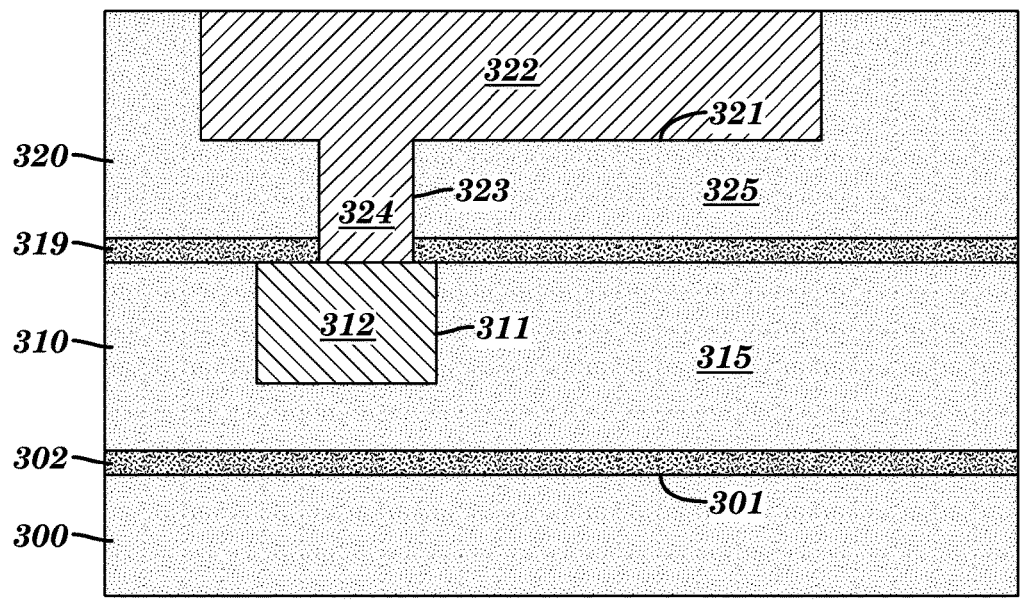
FIGS. 3A and 3B illustrate side views of an embodiment of the present BEOL e-fuse respectively parallel and perpendicular to the major axis of the upper line.
Figure 3B:
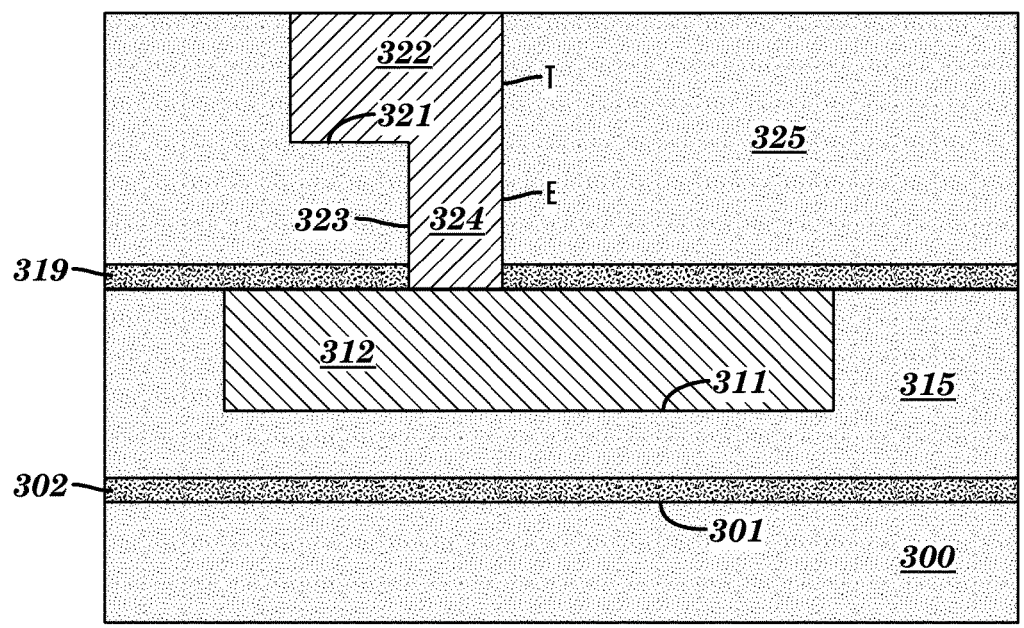

Referring now to FIGS. 3A and 3B, the present e-fuse structure is formed in interconnect metal layers formed on a semiconductor substrate 300. One or more semiconductor devices (not shown) can be formed in or on top surface 301 of the substrate. A so-called middle of the line (MOL) layer 302 which includes structures such as gate contacts formed through a layer of passivation material typically separates surface 301 from a first interconnect layer 310 ("M1") which includes conductive line 312 in trench 311 formed within interlayer dielectric (ILD) 315. Lines formed within M1 may conductively connect to the gate contacts which contacts may be tungsten studs. At least a second interconnect layer 320 is disposed over layer 310 and includes conductive line 322 in trench 321 and conductive via 324 in via cavity 323 formed within ILD 325. ILD 325 can be separated from ILD 315 by a cap layer 319.

The interconnect layer directly overlying the M1 layer can be referred to as the M2 layer. As noted, conductive line 322 is formed in "at least a second interconnect layer" overlying a first interconnect layer 310. A first interconnect layer can be referred to as the M1 layer, and the next overlying interconnect layer as the M2, etc. Within any given Mx layer is formed the Mx lines and the Vx−1 vias. A Vx−1 via can, for example, connect an Mx line and an Mx−1 line.

Figure 3C:
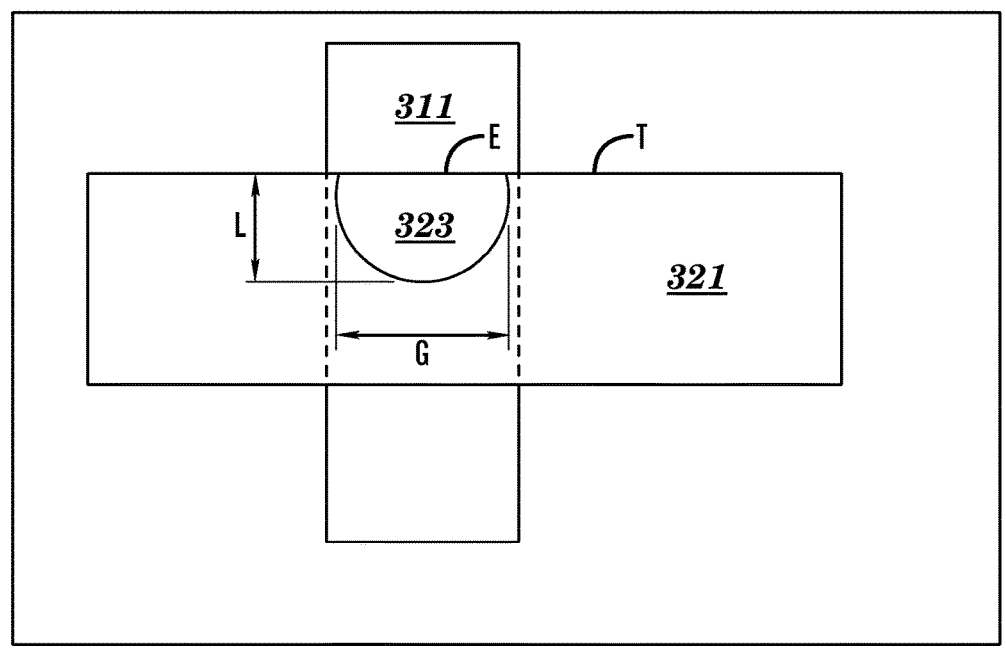
FIG. 3C is a plan view of an embodiment of the BEOL e-fuse of the present invention.

FIG. 3C depicts the patterns produced by a pair of masks which define the Mx+1 trenches and Vx vias onto a plan view of the Mx features (x=1, 2, 3, etc.). As shown in FIG. 3C, trench 321 overlies trench 311. Cavity 323 extends from trench 321 to trench 311. The width of either or both of trench 321 and trench 311 is greater than or equal to 'W', the groundrule dimension. At least one edge 'E' of cavity 323 is coplanar or in perfect alignment with an edge 'T' of trench 321. The larger cross sectional dimension G of cavity 323 can be as large as the groundrule dimension and the smaller cross sectional dimension 'L' is less than G, so that the cross sectional area of via 324 can be significantly smaller than the cross sectional area of line 322.

Figure 4A:
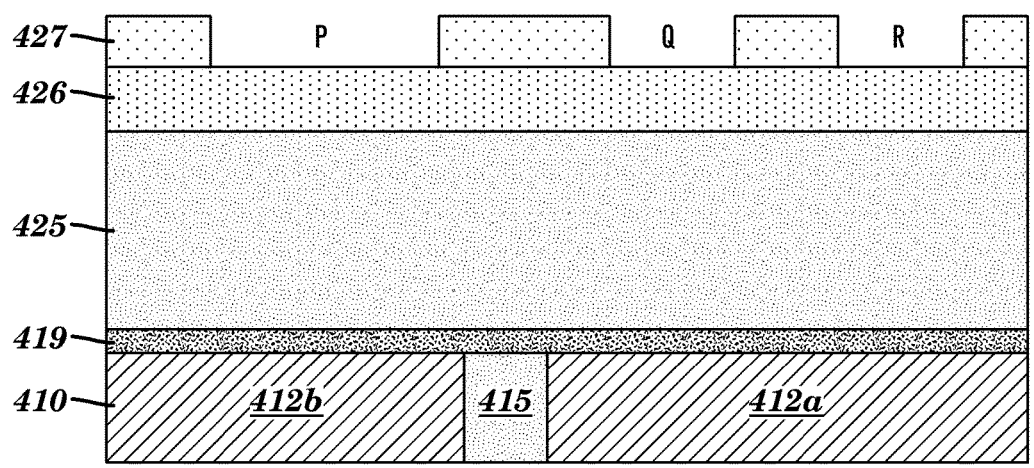
FIGS. 4A to 4F illustrate a method to form the BEOL e-fuse of the present invention.

The BEOL e-fuse of the present invention is formed according to a "line-first" dual damascene scheme illustrated in FIGS. 4A-4F. FIG. 4A illustrates lower conductive lines 412a and 412b formed in a lower layer ILD 415 and covered by cap layer 419. Lower interconnect layer 410 ("Mx") is formed on a structure such as a semiconductor wafer (not shown). Over layer 410 is formed a second ILD layer 425, a hard mask 426, and a photoresist 427. A line pattern is created in photoresist 427 by standard photolithography. Line openings P, Q, and R have length and width according to the chip design embodied in an associated line mask (not shown). Line openings P, Q and R can be patterned at the critical dimension (width W), or they can be wider.

Figure 4B:
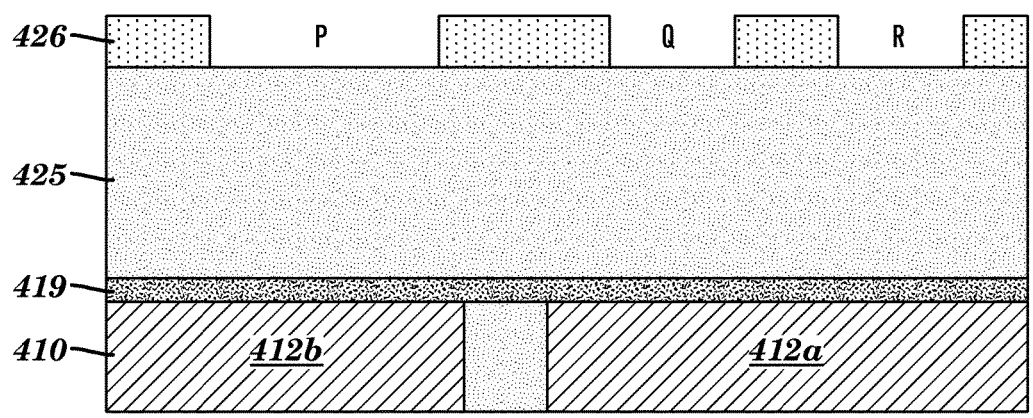

In FIG. 4B, openings P, Q, and R are transferred to hardmask 426 and photoresist 427 is removed per known processing. The steps to this point are consistent with the line-first dual damascene scheme disclosed in "Low-k Interconnect Stack with a Novel Self-Aligned Via Patterning Process for 32 nm High Volume Manufacturing" by R. Brain, et al. (Logic Technology Development, #Quality and Reliability, Intel Corp.)). R. Brain et al propose a line-first scheme to maintain dimensional integrity of a patterned via and avoid the tendency in a via-first scheme for the via pattern to enlarge and thereby short with adjacent features.

Figure 4C:
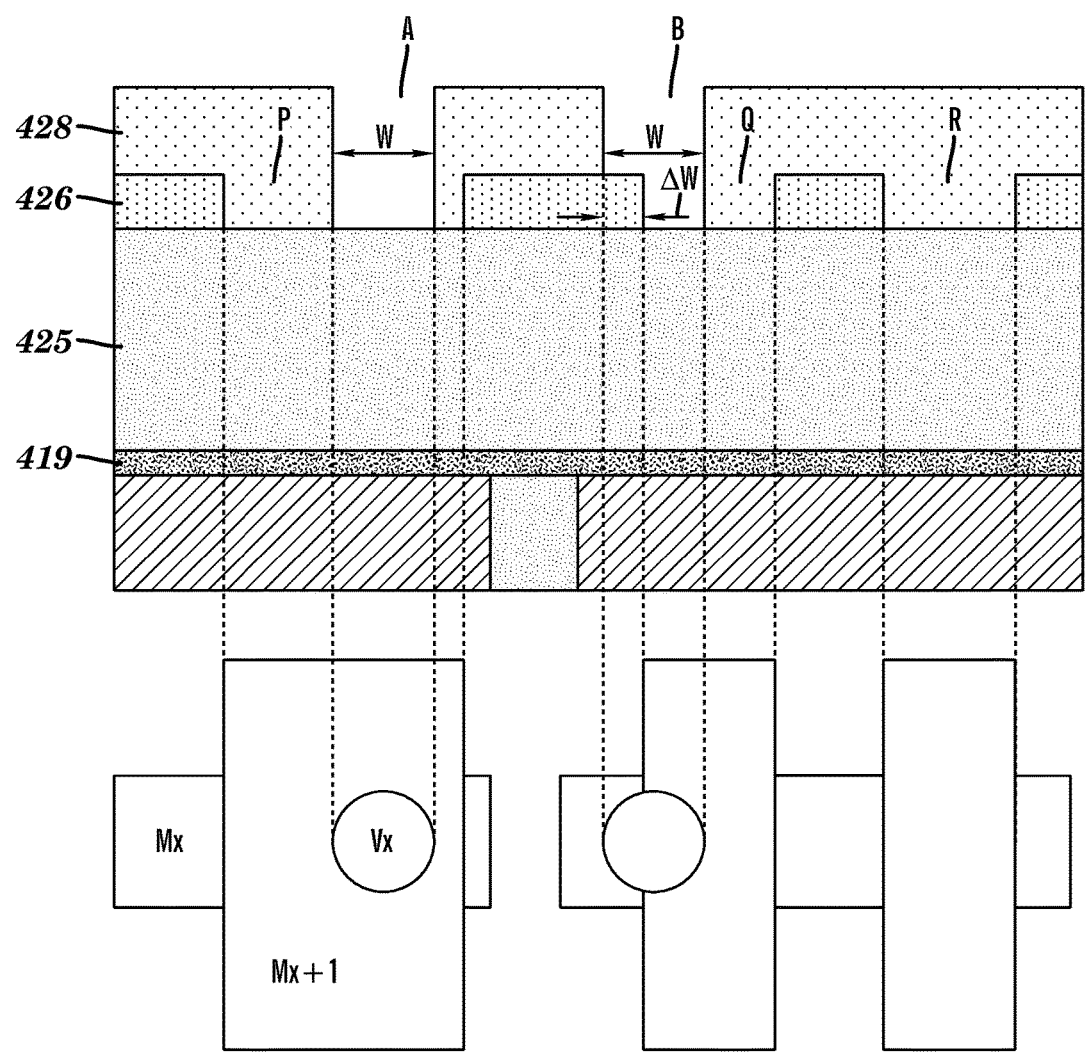

According to the present invention, rather than maintaining the patterned via dimension, the process is altered to reliably form a sub-lithographic via. FIG. 4C shows a second resist layer 428 formed over hardmask 426, and patterned according to a second mask defining vias (not shown). The illustrated embodiment depicts two groundrule (width=W) via openings A and B patterned into via resist 428. According to the chip design (embodied by the mask pair for the corresponding Mx+1 line and Mx via), via opening A can be fully aligned within line opening P, while via opening B can be intentionally misaligned with line opening Q to partially overlie the hardmask by distance 'DELTAW'. The lower section of FIG. 4C illustrates the relative position of openings P, Q, and R (as Mx+1) and A and B (as Vx) overlying the Mx lines. (Note that the via pattern can be other than a circle; e.g., it can be oblong, rectilinear, square or irregular. This invention does not require any specific via shape, and references to a via diameter herein contemplate the circular equivalent of any via shape embodied in a via mask.)

Figure 4D:
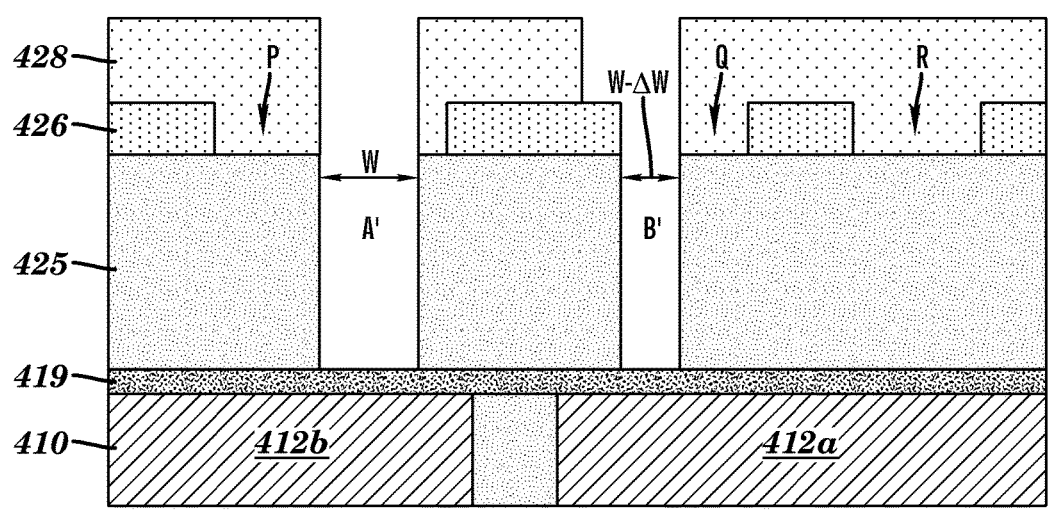

In FIG. 4D, the intersection of the Mx via and Mx+1 line opening pairs is transferred into ILD 425 such as by selective dielectric reactive ion etching (RIE) process. The via opening A is fully aligned within or encompassed by line opening P, so via A' is the same width as via opening A (bounded by the capability of the etch process). As noted, openings A and B were patterned as groundrule dimension openings, so via A' will have the same groundrule dimension 'W' and can be referred to as a "groundrule via". Via opening B is misaligned with line opening Q, such that a portion of via opening B is blocked by the hardmask 426. That part of via opening B which overlies the hardmask does not get transferred into the dielectric 425. The RIE process is designed to be stopped by the hardmask. The resulting physical opening B' in the dielectric has smaller cross section than via opening B in the resist pattern. Via opening B' therefore has a sub-lithographic dimension and can be referred to as a 'sub-groundrule via'. Note, however, that the present invention is not limited to via openings that are the minimum lithographic dimension. Sub-lithographic via B' could result as the intersection of line opening Q and via opening B, even if via opening B (and/or line opening Q) were larger than the groundrule dimension.

Figure 4E:
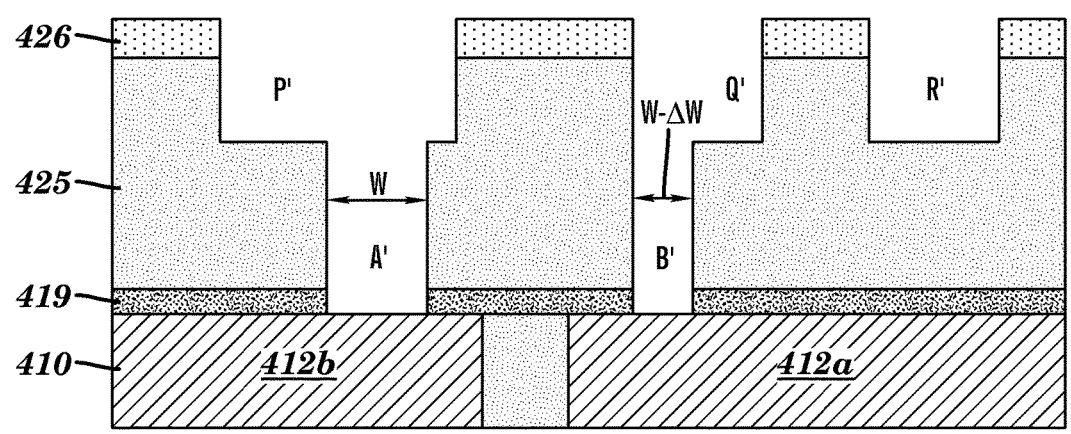
Figure 4F:
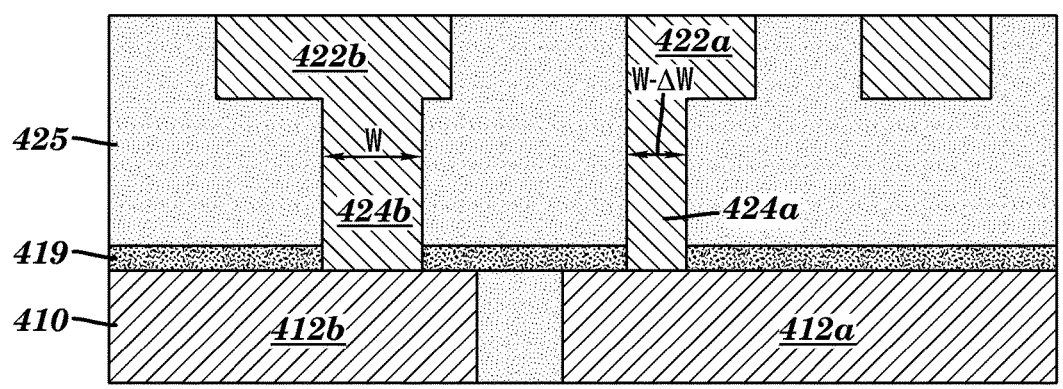

While FIG. 4D shows the via etch reaching to cap 419, the via etch can stop earlier. The via etch might even continue into cap 419. Referring now to FIG. 4E, regardless of the via etch depth, processing can proceed conventionally to remove via resist 428. Further etching can form trenches P', Q' and R' in ILD 425. The initial via etch can be timed such that the trench etch completes the via etch, which may continue through cap 419 at the bottom of vias A' and B'. The completed Mx+1 and Vx features shown in FIG. 4F can be formed according to standard dual damascene metallization by depositing a barrier/liner and a seed layer, copper fill and anneal, and chemical-mechanical planarization. In embodiments, the barrier can be PVD Ta(N); the liner can be CVD tungsten (W), titanium (Ti), cobalt (Co), titanium nitride (TiN), ruthenium nitride (RuN), ruthenium (Ru), etc.; and the seed can be PVD copper (Cu), or copper alloyed with a minority component which can be manganese (Mn), aluminum (Al), tin (Sn), indium (In), or others. Copper fill can be done by CVD or electroplating, and may include bottom-up techniques to fill sub-lithographic cavities. In embodiments, the liner CVD process can deposit cobalt from C12H10O6 (Co)2 (dicobalt hexacarbonyl tert-butylacetylene), ruthenium from triruthenium dodecacarbonyl (Ru3(CO)12), or tungsten from tungsten hexacarbonyl.

The above-described method can be used to form the BEOL e-fuse illustrated in FIGS. 3A and 3B, where line 322 is connected as the anode and line 312 is connected as the cathode. Via 324 has a sub-groundrule dimension which can be sized according to the programming current. Specifically, referring back to FIG. 4C, if groundrule via pattern B were only slightly misaligned to line opening Q, the cross section of a resulting sub-groundrule via B' would be only slightly smaller than that of a groundrule via, such as within the range of 70 to <100 percent of the groundrule dimension. But via pattern B can overlie the hardmask edge by more, and the designed pattern offset can be adjusted to form an e-fuse link having any sub-lithographic cross sectional area, for example 40 percent or 50 percent of the groundrule dimension. According to the present invention, the e-fuse link can be sized to correspond to a target programming current. For example, it may be preferred to blow a particular BEOL e-fuse using a minimal programming current in order to avoid stressing materials comprising or adjacent to the programming current path. The e-fuse link in such case could utilize a groundrule via pattern that only slightly aligns with a line opening.

Figure 5A:
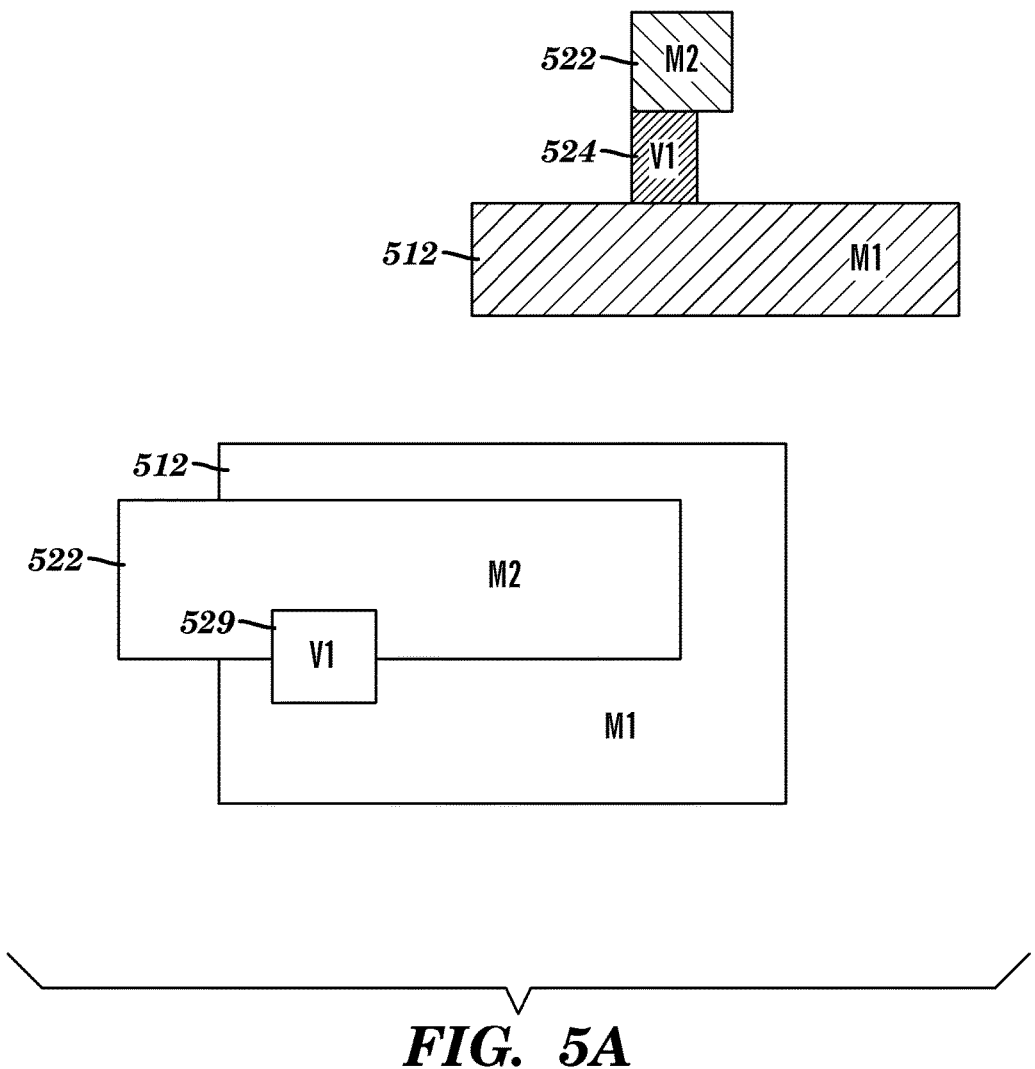
FIGS. 5A, 5B, 6, 7, and 8 illustrate different embodiments of a BEOL e-fuse according to the present invention.
Figure 5B:
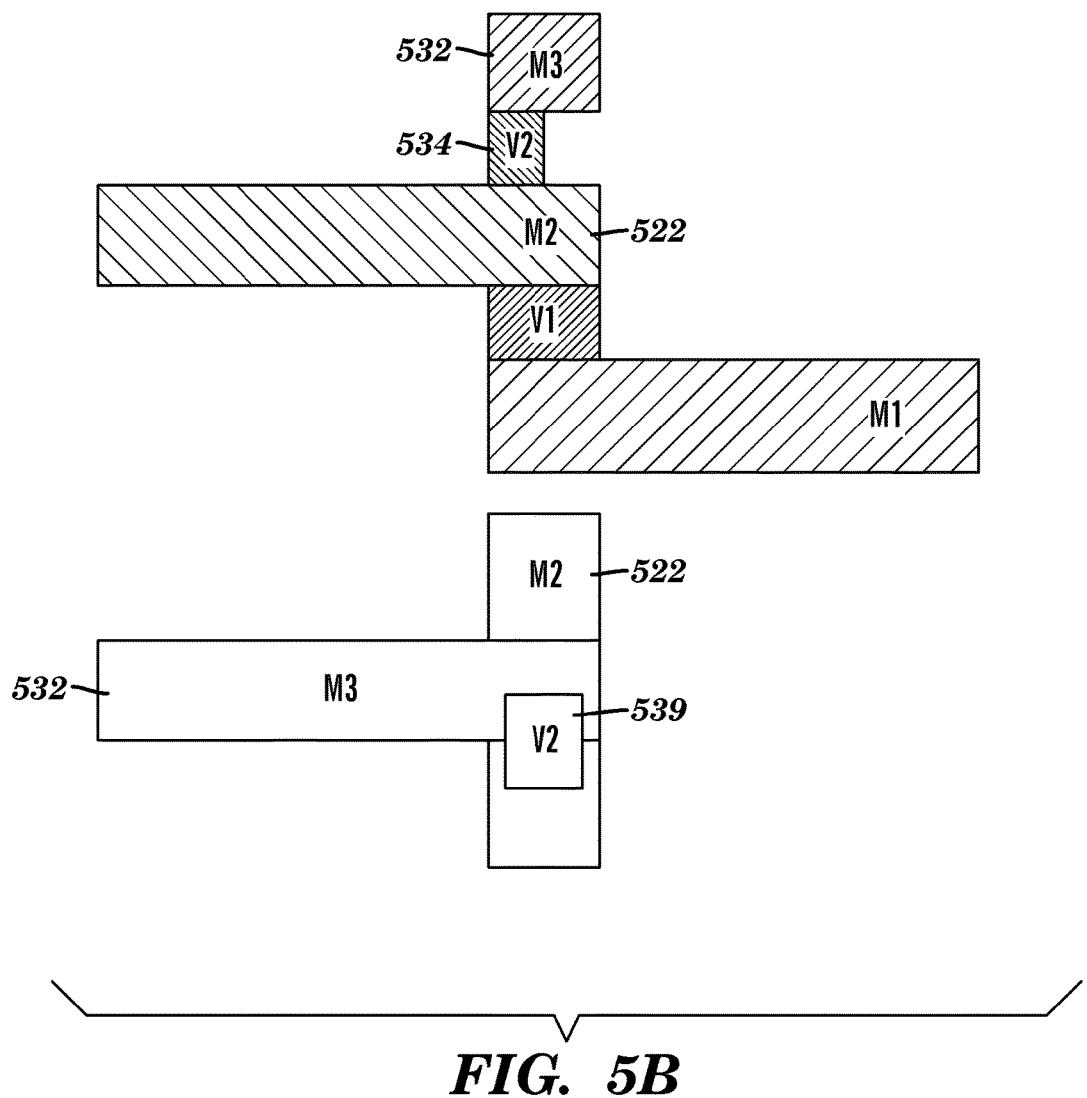
Figure 6:
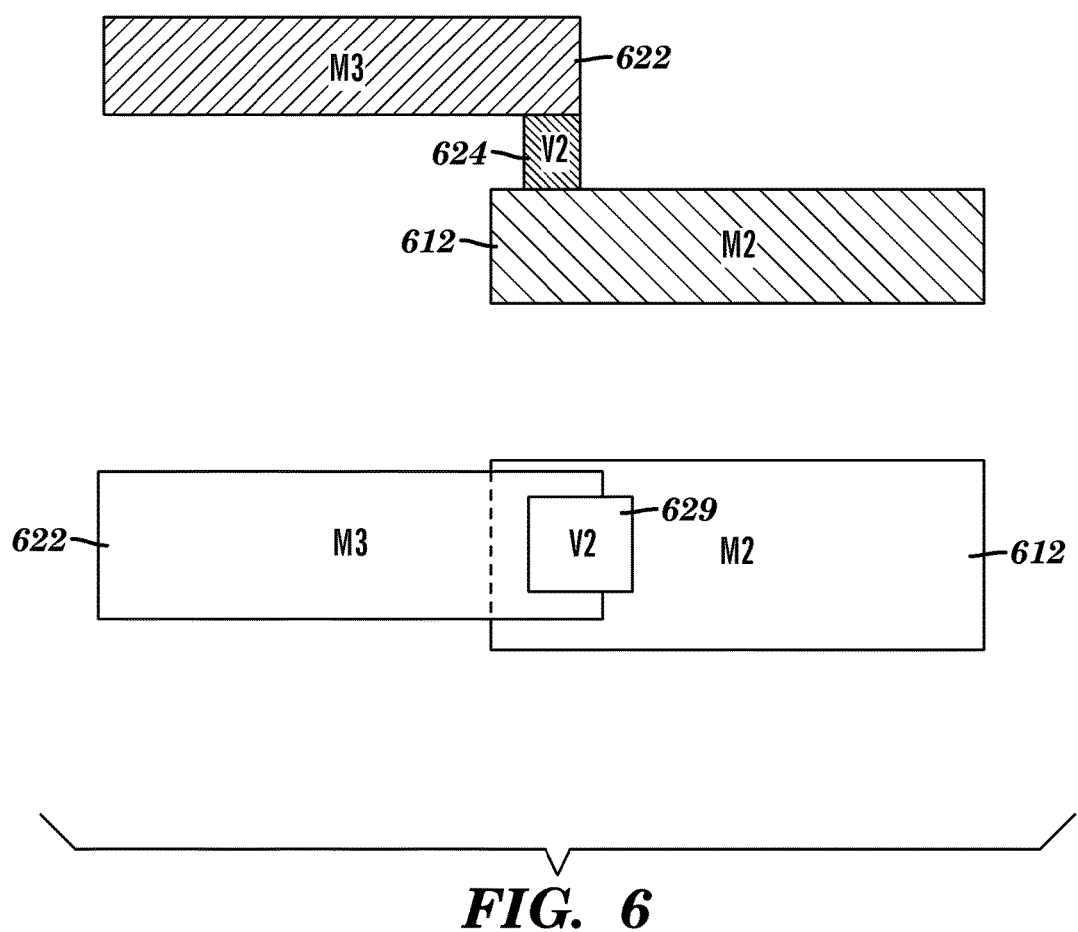
Figure 7:
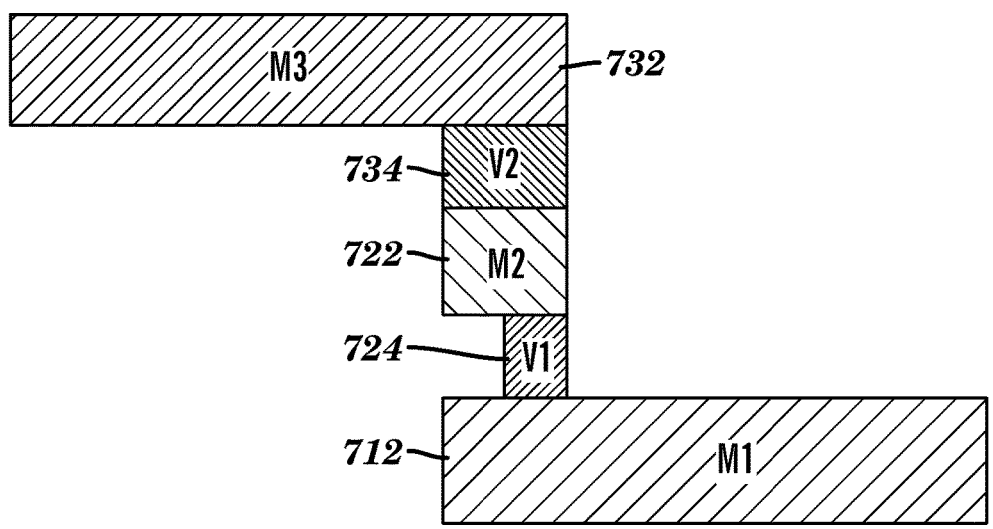
Figure 8:
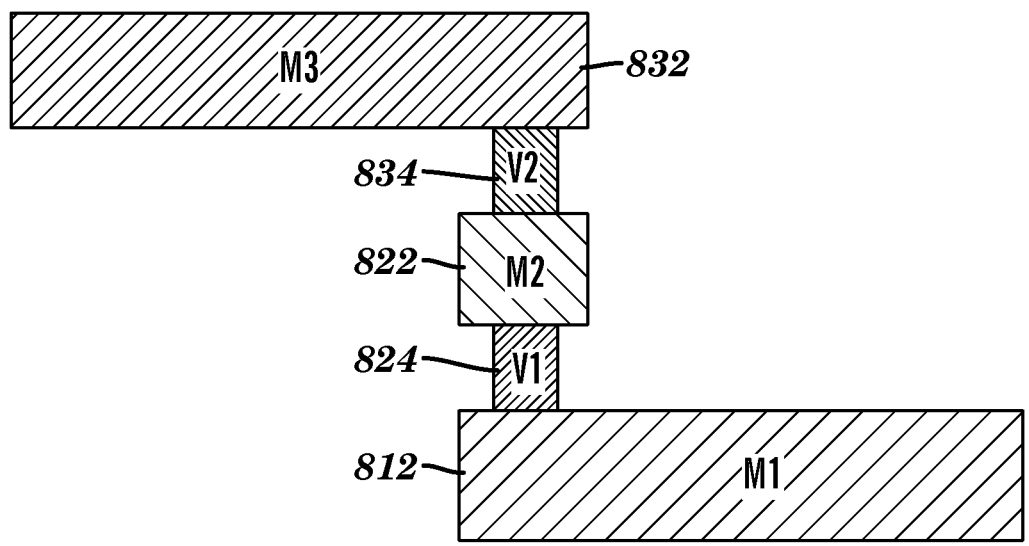

FIGS. 3A, B, and C illustrate a sub-lithographic via connecting lines in adjacent interconnect layers (i.e., Vx, Mx and Mx+1), but this invention is not so limited. FIG. 5A illustrates that sub-ground rule via 524 can connect overlying line 522 to underlying plate 512. Via 524 can be formed by offsetting via opening 529 relative to a hardmask patterned for line 522. Note that via opening 529 could be somewhat larger than the minimum dimension of the lithography, so long as the intersection of opening 529 and 522 is sub-groundrule. FIG. 5B illustrates another embodiment wherein a sub-ground rule via 534 is formed between layers other than M1, such as between line 532 in M3 and line 522 in M2. As shown in FIG. 6, according to yet another embodiment, a sub-lithographic via 624 can be formed by offsetting a via pattern 629 to overlap the end of line pattern 622. The sub-lithographic via formed by such 'end overlap' may be programmable at lower current than a via formed by an equivalent offset relative to an edge of a line, due to foreshortening of the line pattern at its end. As noted, programming at low current can be advantageous in the immediate vicinity of certain devices. FIG. 7 illustrates yet another embodiment wherein the anode 732 and cathode 712 are in non-adjacent layers and are connected by a stack comprising normal via 734, intermediate line 722, and sub-lithographic via 724. FIG. 8 illustrates yet another embodiment wherein the anode 832 and cathode 812 are connected by a stack comprising sub-lithographic via 834, intermediate line 822, and sub-lithographic via 824.

Yet other embodiments have the anode and cathode in same interconnect layer, such as in M2, with the anode and cathode connected through a third line by a path including a sub-lithographic via. To leverage the presence of a grain boundary between dual damascene Mx and Vx features, when that third line is in a layer above the anode and cathode, the BEOL eFuse can include a sub-lithographic via between the cathode and the third line, and when such third line is in a layer below the anode and cathode, the BEOL eFuse can include a sub-lithographic via between the third line and the anode.

The substrate 300 herein may comprise any semiconductor such as Si, SiGe, SiGeC, SiC, Ge alloys, GaAs, InAs, InP and other III/V or II/VI compound semiconductors may be used. In addition to these listed types of semiconducting materials, the present invention also contemplates cases in which the semiconductor substrate is a layered semiconductor such as, for example, Si/SiGe, Si/SiC, silicon-on-insulators (SOIs) or silicon germanium-on-insulators (SGOIs). Further, substrate 300 can be single crystalline, polycrystalline, amorphous, or have a combination of at least two of a single crystalline portion, a polycrystalline portion, and an amorphous portion.

Any suitable dielectric material may be used for the dielectric materials of layers x15 and x25 (where 'x' stands for the corresponding Figure number), and the material used for x15 can be the same or different as that for x25. The dielectric material can have dielectric constant less than 3.9, or for so-called 'low-k' dielectric materials between 2.5-3.0, or for so-called 'ultra low-k' materials even lower such as about 2.2. The dielectric material can be any now known or later developed porous or non-porous dielectric material such as silicon oxide (SiO), silicon nitride ($Si_3N_4$), hydrogenated silicon oxycarbide (SiCOH), silsesquioxanes, carbon-doped oxides (i.e., organosilicates) that include atoms of silicon (Si), carbon (C), oxygen (O), and/or hydrogen (H), thermosetting polyarylene ethers, SiLK™ (a polyarylene ether available from Dow Chemical Corporation), spin-on silicon-carbon contained polymer material available from JSR Corporation, and other low dielectric constant materials or layers thereof.

A dielectric barrier layer or capping layer can be disposed above each of dielectric material layer. The material used for each cap layer x19 or x29 is typically selected to be resistant to the etch and clean processes for the immediately overlying materials. Cap layers can be the same or different materials. Typical materials for the capping layer include any now known or later developed dielectric such a silicon carbide (SiC), silicon nitride ($Si_3N_4$), silicon dioxide ($SiO_2$), and nitrogen or hydrogen doped silicon carbide (SiC(N,H)).

Any suitable conductive material may be used for conductors x12, x22 and x24, and each such conductor can be the same or different material from any other. Typical conductive materials include copper (Cu), aluminum (Al), Tungsten (W), silver (Ag), gold (Au) and alloys.

While the present invention has been particularly shown and described with respect to preferred or alternative embodiments, it will be understood by those skilled in the art that further alternatives are possible and may be made without departing from the spirit and scope of the present invention. It is therefore intended that the present invention not be limited to the exact forms and details described and illustrated.

What is claimed is:

1. A pair of lithographic masks for simultaneously defining Mx+1 lines and both ground rule and sub ground-rule Vx vias to be etched using a single Mx+1 patterning step and a single Vx patterning step, the pair comprising:
   a first mask of the pair patterned with a first trench pattern and a second trench pattern, wherein the first trench pattern is separate from the second trench pattern; and
   a second mask of the pair patterned with a first via pattern having at least a ground rule dimension and a second via pattern having at least a ground rule dimension, wherein, when the first mask and the second mask are aligned:
      the first via pattern partially overlaps the first trench pattern to form a first via opening having a sub-ground rule dimension, and
      the second via pattern fully overlaps the second trench pattern to form a second via opening having at least a ground rule dimension;
   wherein the first mask and the second can be used to simultaneously etch the first via opening and the second via opening in a substrate.

2. The pair of lithographic masks of claim 1, wherein the first via pattern is positioned to partially overlap a side of the first trench pattern.

3. The pair of lithographic masks of claim 1, wherein the first via pattern is positioned to partially overlap an end of the first trench pattern.

4. The pair of lithographic masks of claim 1, wherein a second portion of the first via pattern positioned to not overlap the first trench pattern has a sub-ground rule dimension.

* * * * *